(12) United States Patent
Xiang et al.

(10) Patent No.: US 6,187,657 B1
(45) Date of Patent: Feb. 13, 2001

(54) DUAL MATERIAL GATE MOSFET TECHNIQUE

(75) Inventors: Qi Xiang, Santa Clara; Joong Jeon, Cupertino, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/275,486

(22) Filed: Mar. 24, 1999

(51) Int. Cl.[7] .......................... H01L 21/28; H01L 21/44; H01L 21/3205; H01L 21/4763

(52) U.S. Cl. .......................... 438/596; 438/573; 438/581; 438/655

(58) Field of Search ...................................... 438/605, 572, 438/283, 578, 573, 575, 596, 652, 666, 655, 581

(56) References Cited

U.S. PATENT DOCUMENTS 4,997,779 * 3/1991 Kohno ..................................... 437/41
6,037,200 * 3/2000 Uda et al. ............................. 438/167

OTHER PUBLICATIONS

"Dual–Material Gate (DMG) Field Effect Transistor", Long et al., IEEE Transactions on Electron Devices, vol. 46, No. 5, May 1999, pp. 865–870.*

"Dual Material Gate Field Effect Transistor (DMGFET)", 1997 IEEE,, Wei Long and Ken K. Chin, pp. 549–552.

"Monte Carlo Study of a 50 nm–Dual–Gate HEMT Providing Against Short–Channel Effects", Solid State Electronics, vol. 36, No. 5, pp. 711–715, 1993.

"Split–gate field–effect transistor", Appl. Phys. Lett., vol. 54(2), Michael Shur, Jan. 9, 1989, pp. 162–164.

"A Novel Hetero–Material Gate (HMG) MOSFET for Deep–Submicron ULSI Technology", IEEE Transactions on Electron Devices, Xing Zhou and Wei Long, vol. 45, No. 12, Dec. 1998, pp. 1–3.

* cited by examiner

Primary Examiner—Richard Elms
Assistant Examiner—Adam Pyonin
(74) Attorney, Agent, or Firm—Foley & Lardner

(57) ABSTRACT

This invention comprises a new technique to realize a dual material gate MOSFET. The inventive technique is base upon an asymmetric oxide spacer formation and a self-aligned silicide formation. The asymmetric oxide spacer on the sidewall of the drain side of the gate is formed by selectively etching the spacer on the source side. The etch selectivity is realized by nitrogen implantation into an oxide spacer on the source side, by utilizing preferably an angled ion implantation technique. An HF solution has been experimentally demonstrated to provide an etch rate of the nitrogen implanted oxide that is much faster than the oxide without the nitrogen implantation.

42 Claims, 9 Drawing Sheets

DUAL MATERIAL GATE MOSFET TECHNIQUE

FIELD OF THE INVENTION

The invention relates generally to an integrated circuit (IC). More specifically, this invention relates to the fabrication of a deep submicron complementary metal oxide silicon (CMOS) type device, such as a field-effect transistor (FET) containing a metal gate over thermal oxide over silicon (MOSFET), utilizing a dual material gate for improved performance.

BACKGROUND OF THE INVENTION

Scaling the physical size of CMOS devices has been a principal focus of the microelectronics industry over the last two decades. A more recent scaling technique utilizes a deep-submicron CMOS type process. Deep-submicron CMOS is a primary technology for ultra-large scale integrated-circuit (ULSI) systems.

A MOSFET, by its own geometric nature, is a symmetrical device in the sense that the source and drain are interchangeable. In other words, they are identified by the operating bias rather than the structure. However, as the gate length becomes increasingly small, the device operation is asymmetrical, even at a very low drain bias. This asymmetrical operation results in short-channel effects (SCE), such as threshold voltage roll-off and drain induced barrier loading (DIBL), as well as hot-carrier effects that limit the transistor scaling. As the conventional scaling limit is approached, new structures employing asymmetric architectures must be developed. However, building asymmetrical structures requires that new techniques be developed in order to manufacture these reduced scale designs.

The problems associated with short channel effects, such as threshold voltage roll-off and DIBL that degrade the performance of scaled MOS devices, have been addressed by the recently proposed dual-material gate field-effect transistor (DMGFET). The proposed DMGFET is described in the publication by W. Long and K. K Chin, of a "Dual Material Gate Field Effect Transistor (DMGFET)," IEEE IEDM Tech. Dig., 1997, pp. 549–552 (hereinafter referred to as "Long"), and is based upon the ideas of dual-gate and split-gate transistors.

Dual-gate transistors are discussed in a publication by P. Dollfus and P. Hesto, entitled "Monte Carlo Study of a 50 nm-Dual-Gate HEMT Providing Against Short-Channel Effects," Solid-State Electron., vol. 36, no. 5, pp. 711–715, 1993, (hereinafter referred to as "Dollfus"). Also, split-gate transistors are discussed in a publication by M. Shur, entitled "Split-gate field-effect transistor," Appl. Phys. Lett., vol. 54, no. 2, pp. 162–164, 1989, (hereinafter referred to as "Shur").

The DMGFET has a gate comprising two laterally contacting materials with different work functions. For both an N-channel FET and a P-channel FET, this gate structure takes advantage of a material work function difference.

For an N-channel FET, the threshold voltage near the source is more positive than that near the drain. Utilization of this material work function difference results in a more rapid acceleration of the charge carriers in the channel and a screening effect to suppress the short channel effects.

The DMGFET has shown a significant suppression of short-channel effects, as well as an enhancement of transconductance. These "DMG effects" have been demonstrated with a 1 $\mu$m HFET, and it has been predicted that more benefits could be obtained for devices with ultra-small dimensions. Simulation has shown that, for an N-channel FET, by adding a layer of material with a larger work-function to the source side of the gate, short channel effects of an N-channel FET can be greatly suppressed without degrading the driving ability. These "DMG effects" are discussed in more detail in the publication by Xing Zhou and Wei Long, entitled "A Novel Hetero-Material Gate (HMG) MOSFET for Deep-Submicron ULSI Technology", IEEE Trans., Electron. Dev., vol. 45, no. 12, 1998, (hereinafter referred to as "Zhou").

Each of the four above referenced publications, Long, Dollfus, Shur, and Zhou, are each incorporated by reference as though fully set forth herein.

Accordingly, for a P-channel FET, by adding a layer of material with a smaller work-function to the source side of the gate, the short channel effects of a P-channel FET can be greatly suppressed. It is of vital importance, however, that such novel devices can be integrated into the current ULSI technology.

Both the Long and Zhou references discuss the manufacture of dual material gates. However, some problems exist with the conventional techniques of forming dual material gate devices.

The Long reference describes the conventional technique for fabricating a dual material gate device, but for a metal gate. For example, to form a dual material gate of 1 $\mu$m in length, a first gate material is evaporated with a carefully controlled tilt angle, and then a second material is formed using conventional evaporation. Unfortunately, this tilt evaporation technique is not easily transferable to polysilicon gates. Further, this tilt technique is not easily integrated with other process steps currently utilized in the fabrication of high density CMOS type devices.

In the Zhou reference, Zhou concludes that "a technology breakthrough in realizing the proposed device would have tremendous impact on the ULSI technology." The present invention provides one such breakthrough.

SUMMARY OF THE INVENTION

This invention relates to a method of manufacturing an integrated circuit. This invention also relates to a circuit product that is manufactured by a method described herein.

An object of the invention is to provide for a fabrication technique that may be utilized with polysilicon gate materials. Another object of the invention is to provide a technique that is relatively integratable with other process steps currently utilized in the fabrication of high density CMOS type devices.

Yet another object of the invention is to provide a new technique to realize the above-mentioned dual material gate MOSFET. In one preferred arrangement, the proposed technique is based upon an asymmetric oxide spacer formation and a self-aligned silicide formation.

The invention may be characterized, for example, as an asymmetric oxide spacer on the sidewall of a first side of a gate that is formed by selectively etching a spacer layer on the opposite, i.e., second, side. The etch selectivity is preferably realized by nitrogen implantation into an oxide spacer on the second side. It has been experimentally demonstrated that, with an HF solution, the etch rate of the nitrogen implanted oxide is much faster than that of the oxide without the nitrogen implantation.

The invention may also be characterized as a method of forming a dual-material gate for an FET comprising the following steps. First, a gate structure is provided on a substrate, the gate having a first and second side. Next, a barrier layer is formed over the gate structure, a first portion of the barrier layer adjacent the first side, and a second portion of the barrier layer adjacent the second side. Ions are then directed at an angle so as to implant onto the gate structure and substrate, wherein the angle cooperates with the gate structure to shield the first portion against the ions. Thus, a relatively lower concentration of ions are formed in the first portion than in the second portion, thereby comprising a different ion concentration relationship. The second portion is then removed, while retaining the first portion, in a selective etching process based upon the different ion concentration relationship. Next, a silicide region is formed in the second side of the gate structure by utilizing the first portion of the first layer as a shield. Finally, the first portion of the first layer is removed.

Additional advantages and other features of the invention will be set forth in part in the description that follows, and in part will become apparent, to those having ordinary skill in the art, upon examination of the following or that may be learned from the practice of the invention. The objects and advantages of the invention may be realized and obtained as particularly pointed out in the appended claims.

BRIEF DESCRIPTION OF THE DRAWINGS

The invention is described in detail herein with reference to the drawings in which.

Figure 1:
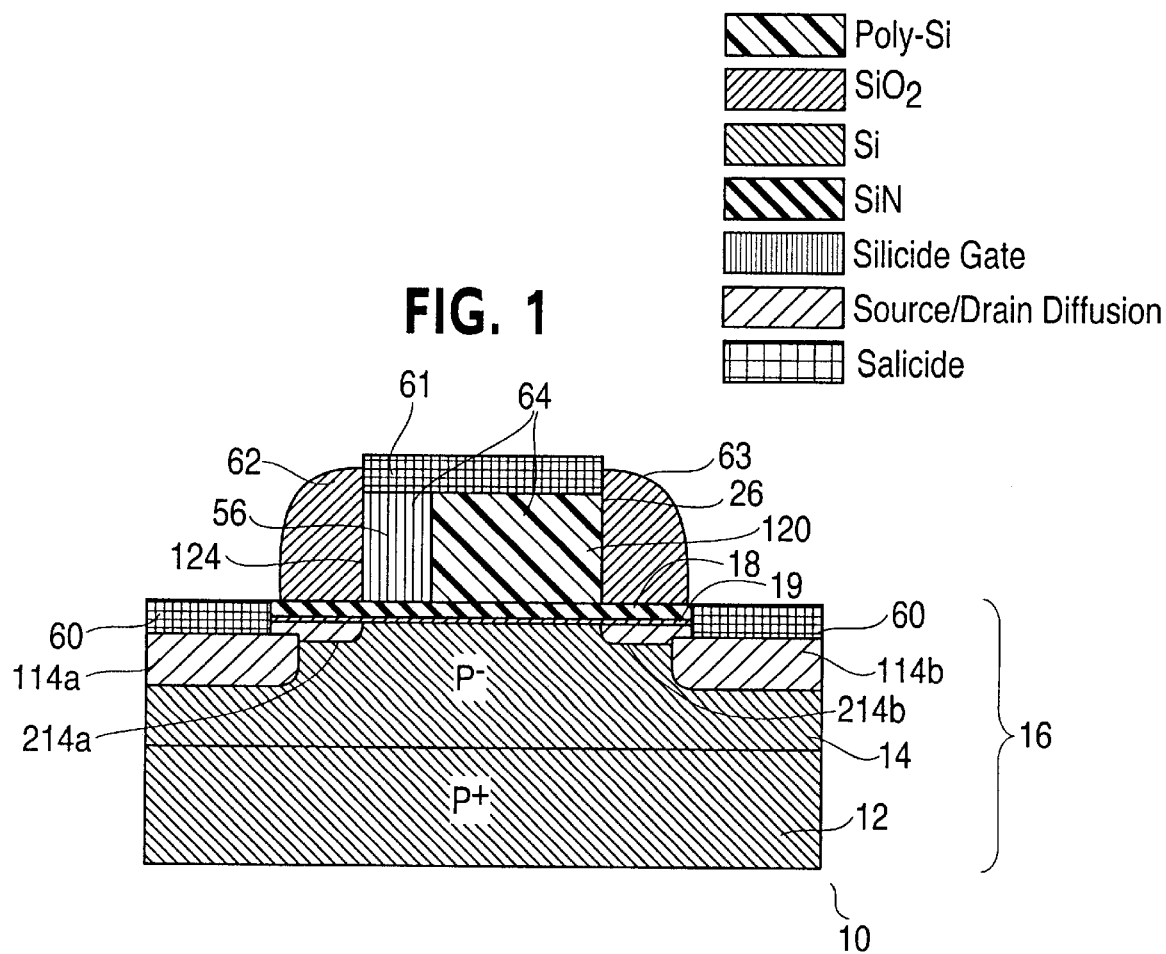
FIG. 1 illustrates a cross-section of a preferred polysilicon gate electrode resulting from the practice of the invention.

The accompanying drawings, wherein like numerals denote like elements, are incorporated into and constitute a part of the specification, and illustrate presently preferred exemplary embodiments of the invention. The drawings, together with the general description given above, and in the detailed description of the preferred embodiments given below, serve to explain the principles of the invention.

DETAILED DESCRIPTION OF THE PREFERRED EMBODIMENT

The invention is illustrated utilizing a semiconductor device 10. FIGS. 1–9 illustrate various portions of a technique in the practice of the current invention. In the following description, the same reference numerals are utilized for substantially similar elements in FIGS. 1–9, for the purpose of clarity. However, it will be apparent to one skilled in the art, for example, that some of the "like" elements may not actually be substantially similar or identical, after various steps in the semiconductor process, due to ion implantation, rapid thermal processing, etching, and the like. Also, embodiments of the invention, as one skilled in the art recognizes, may be practiced on devices with these variations, and differences, as well as on other alternate embodiments, and all are within the scope of this description and the appended claims.

FIG. 1 illustrates an example of a dual material gate electrode as a preferred embodiment of the invention. While the following description utilizes a gate of two materials, the technique of this invention may also be applied to a gate comprised of a plurality of materials.

The example of FIG. 1 shows a substrate 16 comprised of a first region 12 and a second region 14. As shown, a dielectric film, also known as a nitride/oxide or "NO" layer, is comprised of a substrate layer 18, together with a first $SiO_2$ layer 19, that serve as a dielectric and a gate insulator, respectively. The film has been formed upon the second region 14, where the first $SiO_2$ layer 19 is formed between the second region 14 and the substrate layer 18. The substrate layer 18, and the first $SiO_2$ layer 19, are also considered to be a part of the substrate 16 for the purposes of this description. However, they may alternatively be considered independently from the substrate. Also, an alternate to the nitride/oxide, or "NO" layer shown may include, for example, an oxide/nitride/oxide "ONO" layer, and other various dielectric layer constructions.

Formed within the substrate 16 are the source/drain diffusion areas. More particularly, as shown in this P-type example, the source area 114a, source extension 214a, drain area 114b, and drain extension 214b are formed in the substrate 16. First, the source/drain extensions are lightly doped. These lightly doped source/drain extensions 214a, 214b are preferably disposed partially underneath the gate structure 64 to help reduce short channel effects.

Next, for example, an oxide layer, e.g., $SiO_2$, may be deposited and etched to act as a set of spacers 62, 63. These spacers 62, 63 act as ion implantation masks of the source extension 214a and drain extension 214b, respectively, during a subsequent heavy doping of the source area 114a and drain area 114b. Each of these source/drain diffusion areas and extensions may be doped with a P-type dopant, e.g., boron, in the case of an N-doped substrate. Alternatively, an N-type dopant, e.g., phosphorous, may be utilized in the case of a P-doped substrate.

After ion implantation, a refractory metal may be deposited, and a self aligned silicide (salicide) region 60 may be formed by reaction with an underlying layer, for example, by an alloy step. The unreacted refractory metal is then removed from the surface.

Adjacent each source/drain diffusion area 114, as shown in FIG. 1, two salicide regions 60 have been formed. In-between the two salicide regions 60, and upon the substrate 16, the dual material gate 64 structure has also been formed. The dual material gate 64 comprises a polysilicon modified gate electrode 120 material, and a silicidation portion 56 gate electrode material.

Deposited on each side of the dual material gate 64 are $SiO_2$ sidewall deposits 62. Also, a salicide top region 61 is shown on top of the dual material gate 64. Salicide top region 61 is formed similarly to salicide regions 60. For salicide regions 60 and the salicide top region 61, the refractory metal may comprise the same metal, or a different metal, as that utilized to form a silicidation portion 56. Formation of the silicidation portion 56 is described in more detail below. Some examples of suicides that may be utilized in the practice of this invention include $TiSi_2$, $CoSi_2$, and NiSi.

As shown in FIG. 1, the dual material gate preferably comprises two laterally contacting materials with different work functions. For both an N-channel FET and a P-channel FET, this gate structure takes advantage of a material work function difference.

A source side gate material with a different work function may be utilized, in the practice of this invention, for an N-channel FET, as compared to a P-channel FET. However, in a preferred arrangement, a gate material on the source side is comprised of a material with the same work function, e.g., the same silicide material, for both an N-channel FET and a P-channel FET. The gate material on the drain side is then preferably comprised of, e.g., an N-type polysilicon, and a P-type polysilicon, respectively.

For example, to fabricate a preferred N-channel FET utilizing a source side gate material with a particular work function, an N-type material with a work function that is lower than the source side gate material may be utilized, e.g., an N-type polysilicon. Alternately, to fabricate a preferred P-channel FET, that utilizes a source side gate material with the same particular work function, a P-type material with a work function that is higher than the work function of the source side gate material may be utilized, e.g., a P-type polysilicon. In other words, the work function of the source side gate material, e.g., silicide side, of the dual material gate has a work function that is lower than the P-type gate material utilized, and a higher work function than the N-type gate material utilized.

FIGS. 2–9 illustrate the steps utilized in accordance with embodiments of the invention to fabricate the structure shown in FIG. 1.

Figure 2:
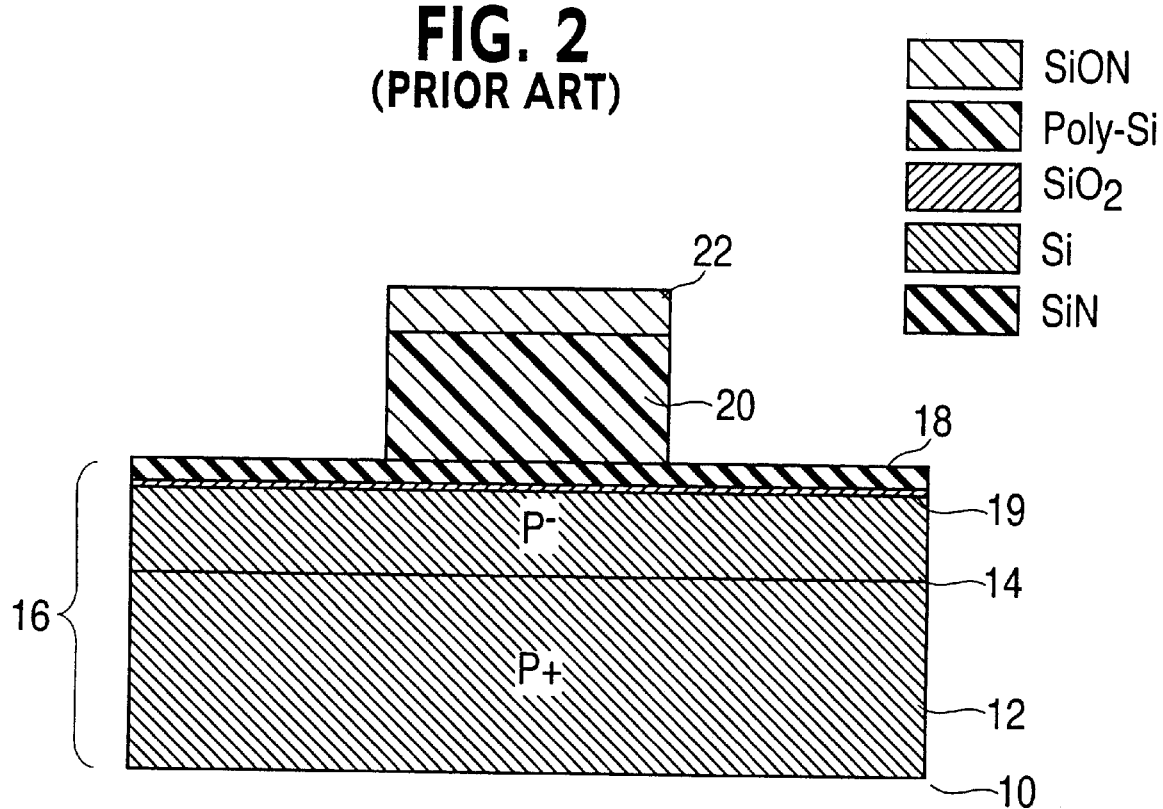
FIG. 2 is a cross-section of a polysilicon gate structure that may be used in the practice of the invention.

FIG. 2 illustrates a partially constructed semiconductor device 10 which may be fabricated by conventional techniques. The semiconductor device 10 comprises a first P+ region 12 and a second P− region 14 forming at least a portion of a semiconductor substrate 16. The substrate may be fabricated utilizing a form of silicon. As previously mentioned, in FIG. 2 a substrate layer 18 and a first $SiO_2$ layer 19 are also formed as a part of the substrate 16. The substrate layer 18 may be fabricated utilizing a form of SiN or other gate insulator material.

In alternative embodiments of the invention, the term "substrate" may include only the silicon-based first portion 12 or additionally the second portion 14. This "substrate" in other alternative embodiments, may include for example, an $SiO_2$ or an $Si_3N_4$ layer in addition to the silicon-based first portion 12 and second portion 14. In this regard, the term "substrate" is being used to generally define the elements or layers that underlie a layer or portions of interest, for example, in this case a gate electrode region. Also, the "substrate" may be a superconductor base or any other base upon which a layer is deposited, for example, a metal layer.

Preferably, in substrate 16, the first region 12 and second region 14 comprise a P-type material. The P-type material is a semiconductor material in which the majority carriers are "holes" and therefore positive. As previously described above, P-type regions may be formed utilizing dopants.

In FIG. 2, a polysilicon gate electrode 20 has been formed over the substrate 16, comprising, for example, the nitride/oxide stack gate dielectric, e.g., formed from the first $SiO_2$ layer 19 and substrate layer 18, and comprising the first P+ region 12 and the second P− region 14.

The polysilicon gate electrode 20 may be formed, for example, by patterning and etching a polysilicon layer utilizing the nitride substrate layer 18 as an etch stop. For example, a selective gate etching solution may be utilized to etch a layer of polysilicon, so as to leave the polysilicon gate electrode 20 that is defined by the SiON layer portion 22. One gate etching method utilizes an etch chamber having a nitrogen sensor. When the gate etching solution reaches the substrate layer 18, preferably comprised of SiN, nitrogen is released. Upon sensing the nitrogen, the sensor then signals a termination of the gate etching process.

FIG. 2 also shows the SiON layer 22 on the top of the polysilicon gate electrode 20. The SiON layer 22, for example, may comprise a conventional bottom anti-reflective coating (BARC) layer for lithography. The construction up to this point of the embodiment shown in FIG. 2 is preferably fabricated using conventional techniques.

Figure 3:
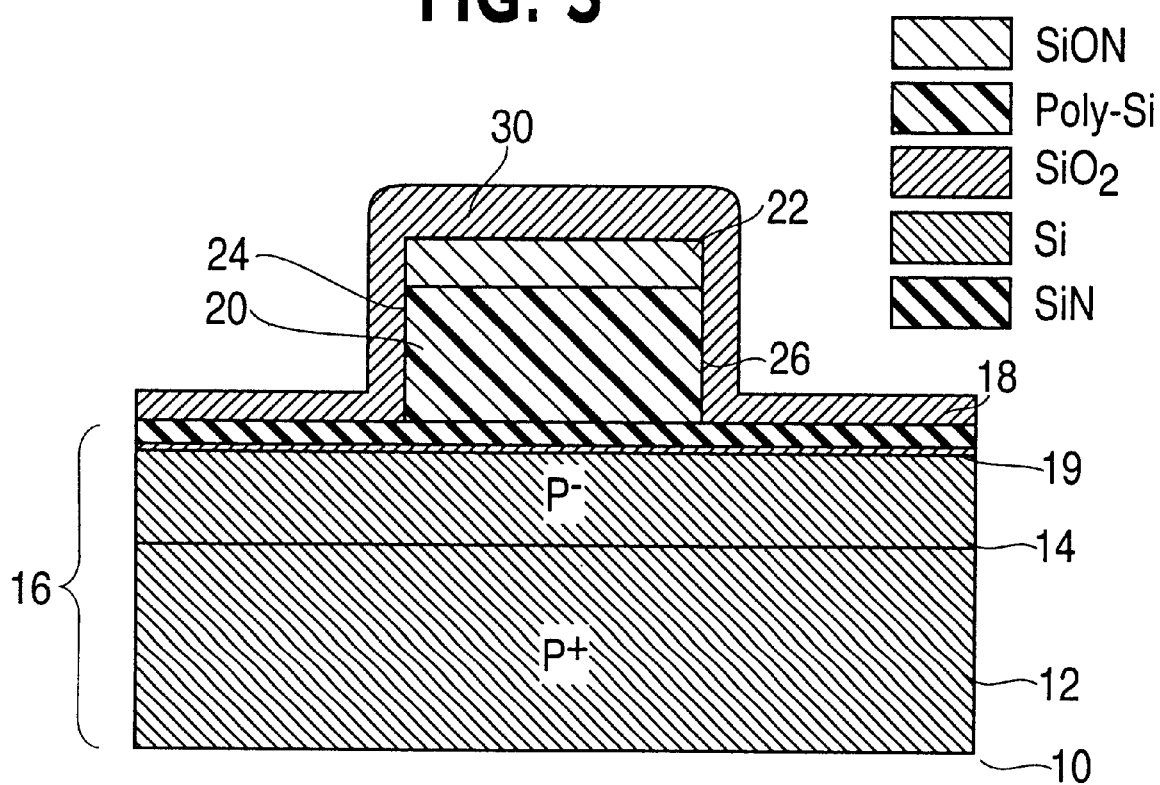
FIG. 3 is a cross-section of the polysilicon gate structure of FIG. 2 illustrating a layer deposition by CVD.

FIG. 3 illustrates, in a cross-sectional view, the semiconductor device 10 of FIG. 2 after a second layer 30 is deposited on top of the substrate 16. The second layer 30 may be formed of an oxide, for example, such as silicon dioxide ($SiO_2$) as shown in FIG. 3. The second oxide layer 30 is preferably deposited on top of the substrate 16, and on the top of the cap SiON layer 22, a first sidewall 24 of the gate electrode 20, and a second sidewall 26 of the gate electrode 20. However, the only required area of formation is adjacent to the second sidewall 26 of gate electrode 20.

Preferably, the second oxide layer 30 is deposited by a chemical vapor deposition (CVD) technique. However, other various conventional deposition techniques may be utilized.

Figure 4:
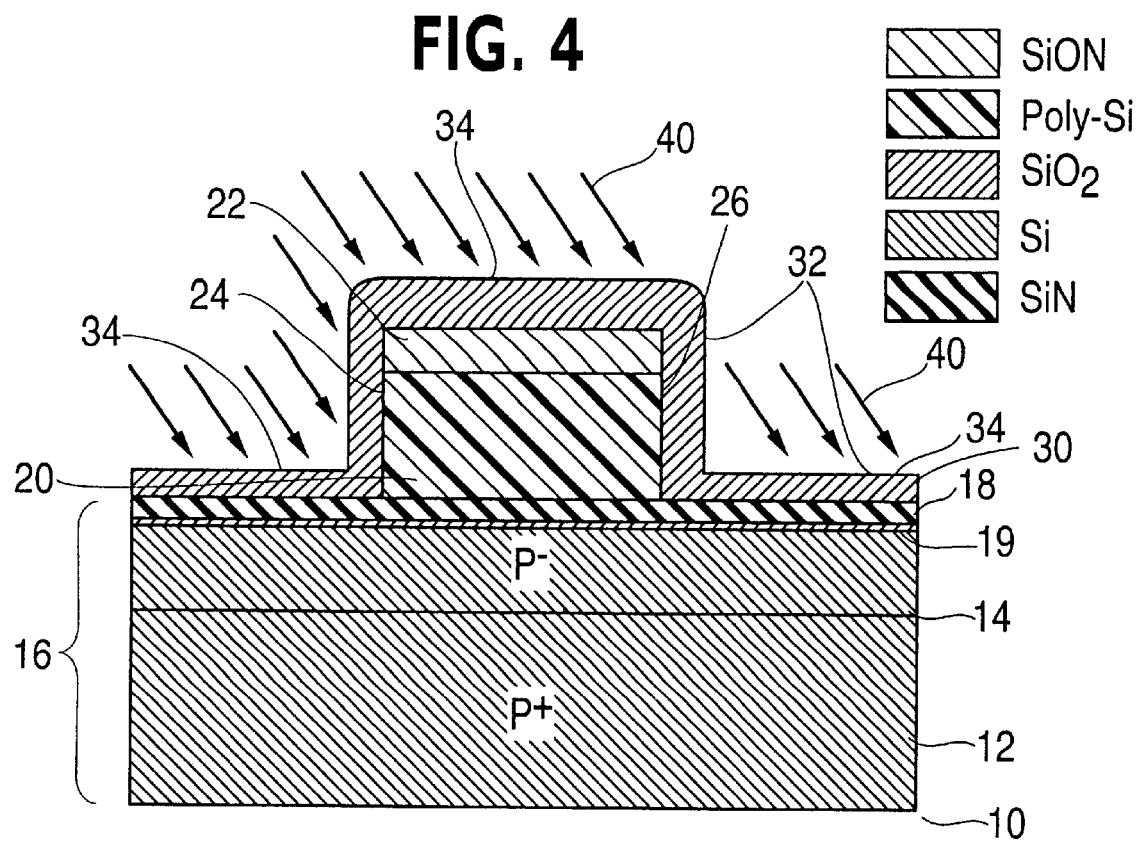
FIG. 4 is a cross-section of the polysilicon gate structure shown in FIG. 3 illustrating an implantation of an angled ion.

FIG. 4 shows the semiconductor device 10 of FIG. 3 during an ion 40 implantation phase. The ions 40 are projected at an angle with respect to the substrate 16. This angle results in an asymmetric implantation of the ions. For example, the ions 40 are angled so that they are implanted in an ion implantation portion 34 of the second, or oxide, layer 30. Because of the angle, the ions 40 are not implanted at as large a concentration on a non-ion implantation portion 32, which is the region shielded by the gate 20 and cap layer 22. Thus, the concentration of ion implantation is larger in the implantation portion 34, and is smaller in the non-ion implantation portion 32.

This technique preferably results in ion implantation generally over the second oxide layer 30, except for the non-ion implantation portion 32. More specifically, the implantation portion 34 includes the second oxide layer 30 that is adjacent to the substrate 16, and the second oxide layer 30 portion that is adjacent to the SiON layer 22. The ion implantation also occurs in the second oxide layer 30 where it is adjacent to the first sidewall 24 of the gate electrode 20. However, as shown in FIG. 4, the non-ion implantation portion 32 of the second oxide layer 30 includes an area of the second oxide layer 30 that is adjacent to the second sidewall 26 of the gate electrode 20, as well as the portion of the second oxide layer 30 that is adjacent to a portion of the substrate 16 that is adjacent to the second sidewall 26 of gate electrode 20.

Also, the ion implantation is preferably accomplished by projecting nitrogen ions at an angle, as shown, to result in a "shadow effect." The shadow effect is preferably realized where the portion 32 is not substantially implanted with nitrogen ions.

In this example, and comparing FIG. 1 with FIG. 4, it may be seen that an area under the first sidewall 24 will function as a source side of the semiconductor device and an area under the second sidewall 26 of the gate electrode 20 will function as a drain side of the semiconductor device. Alternatively, for an N-type device, the source and drain sides would be reversed.

Figure 5:
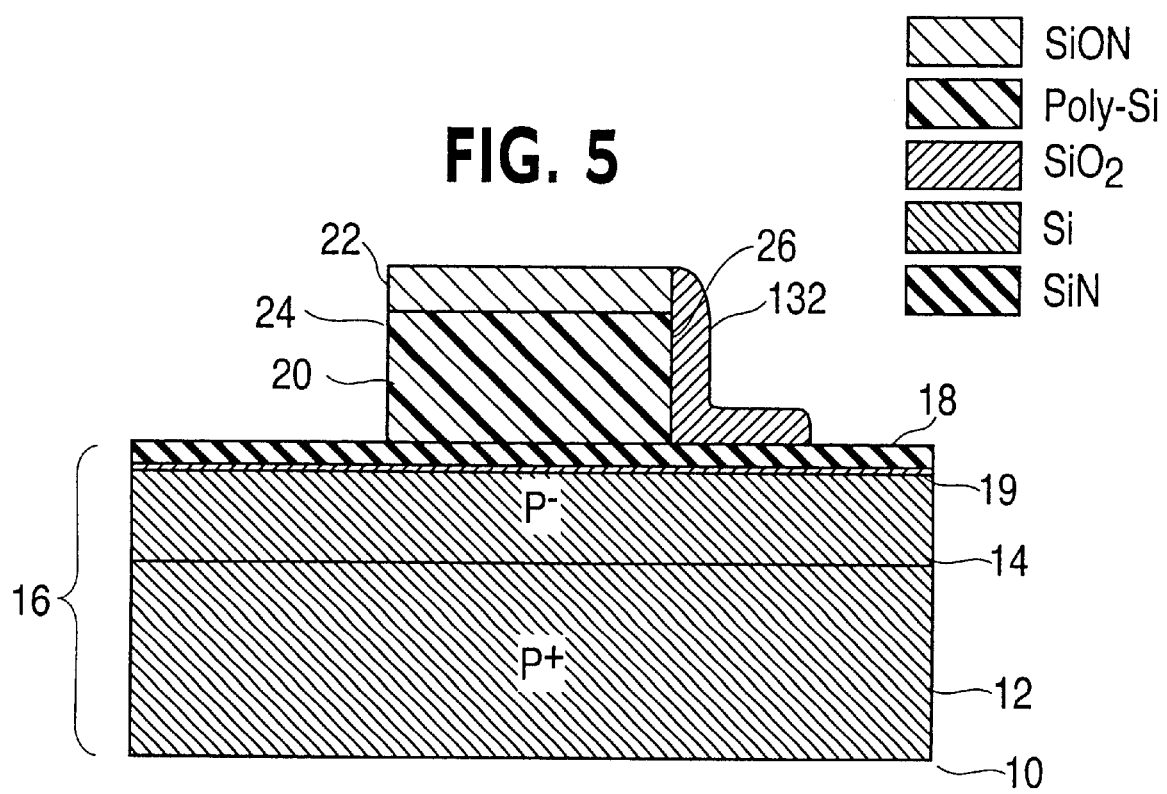
FIG. 5 is a cross-section of the polysilicon gate structure of FIG. 4 illustrating a selective etching after ion implantation.

FIG. 5 shows the semiconductor device 10 of FIG. 4 after a selective etching of the second oxide layer 30 has been performed. The selective etch is preferably accomplished by utilizing an etching solution such as an HF solution, for example, on $SiO_2$, where the etch rate of a nitrogen implanted oxide is faster than an etch rate of the oxide without a nitrogen implantation.

After the etching process, the substantially non-ion implantated portion 32 of the second oxide layer 30 remains in place on the semiconductor device 10. Preferably, most of the non-implantation portion 32 will remain even after substantially all of the implantation portion 34 of the second oxide layer 30 has been selectively etched and removed from the semiconductor device 10. The remaining part that is not selectively etched away is the non-implantation portion 132.

Figure 6:
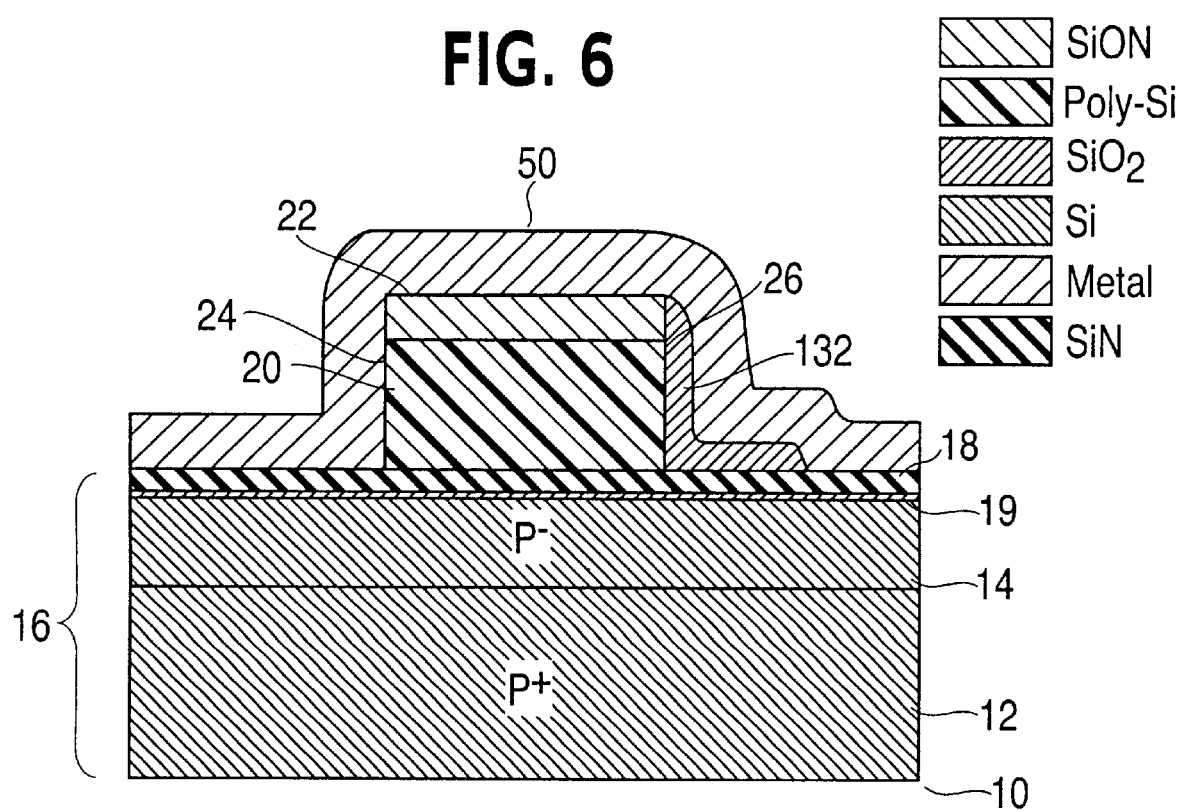
FIG. 6 is a cross-section of the polysilicon gate structure of FIG. 5 illustrating a deposition of a metal layer.

Next, as shown in FIG. 6, preferably a metal layer 50 is deposited upon the substrate 16, the cap SiON layer 22 that caps the gate electrode 20, the first sidewall 24 of the gate electrode 20, and the exposed surface of the remaining non-ion implanted portion 132 of the second oxide layer 30.

Figure 7:
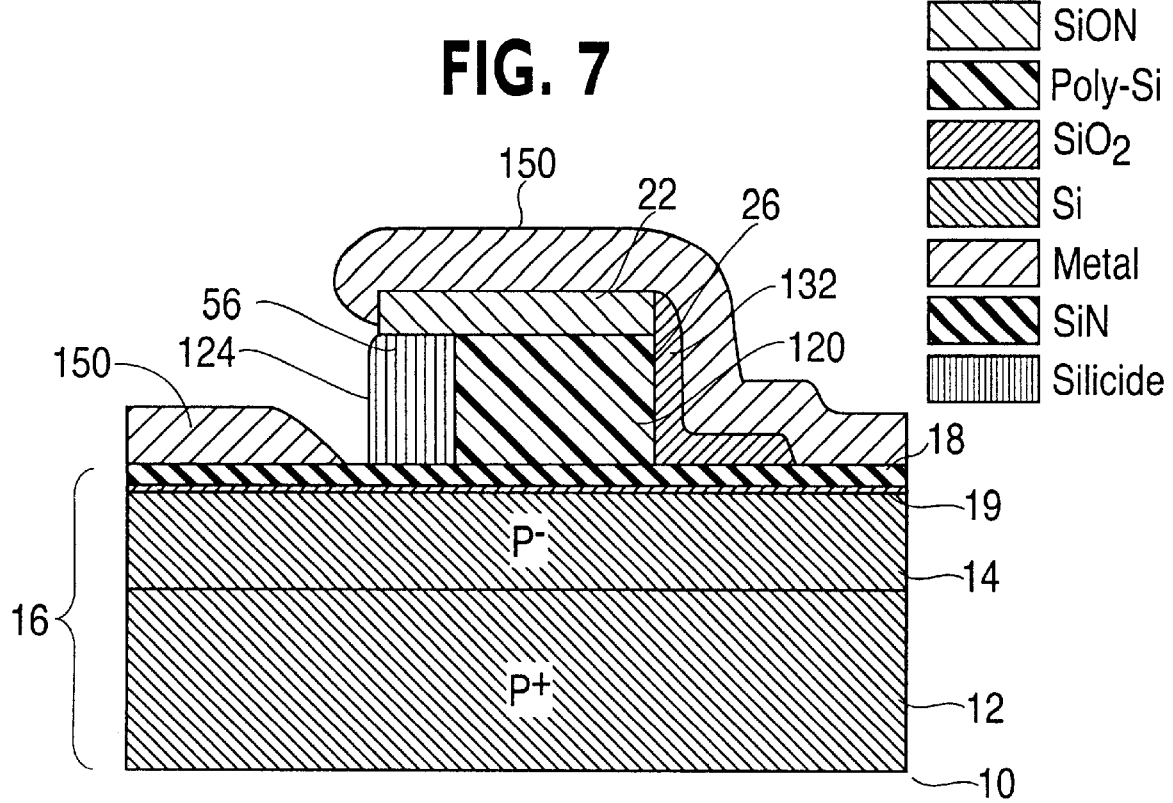
FIG. 7 is a cross-section of the polysilicon gate structure of FIG. 6 illustrating a silicidation RTA technique.

Then, as shown in FIG. 7, the deposited metal layer 50, in the area of the first sidewall 24 of FIG. 6, is processed along with the semiconductor device 10. The process utilized is a silicidation RTA type technique so as to form a silicide portion 56 that replaces the first sidewall 24 to form the silicide sidewall 124 of a modified gate electrode 120. During the silicidation technique, the remaining non-ion implanted portion 132 protects the first side 26 from silicidation.

Figure 8:
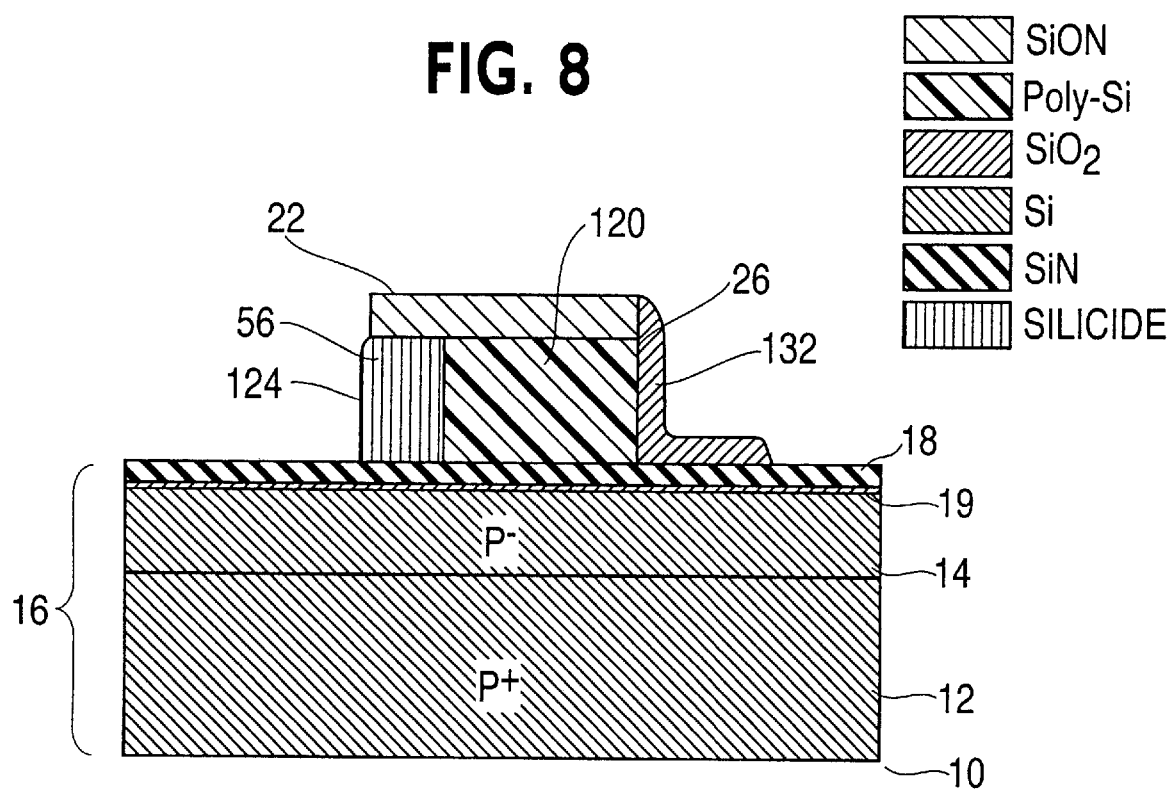
FIG. 8 is a cross-section of the polysilicon gate structure as shown in FIG. 7 illustrating a stripping of the metal layer.

FIG. 8 shows the semiconductor device 10 after a metal stripping technique has occurred. The metal stripping technique removes the unsilicided metal 150, as shown in FIG. 7, and leaves most of the silicidation portion 56, as shown in FIG. 8. This silicidation portion 56 forms the silicide sidewall 124 of the modified gate electrode 120. As previously mentioned, in a preferred embodiment, the silicide sidewall portion 56, combined with the modified gate electrode 120 may function as the dual material gate 64 of a dual material gate MOSFET circuit device.

Figure 9:
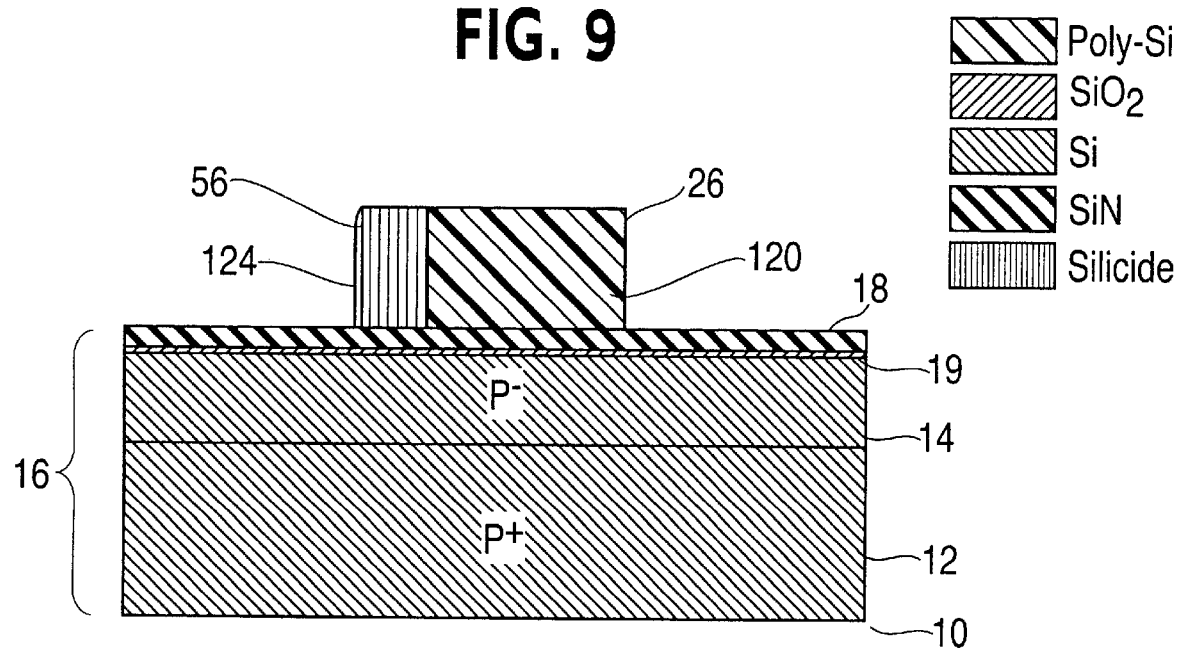
FIG. 9 is a cross-section of the polysilicon gate structure as shown in FIG. 8 illustrating a stripping technique to leave a dual material gate.

Finally, FIG. 9 shows a cross-section of the semiconductor device 10 as shown in FIG. 8, after stripping the cap SiON layer 22 and the remaining non-ion implanted portion ($SiO_2$) 132. After stripping, substantially most and preferably all of the non-ion implantated portion 132 is removed from the substrate 16 and the second sidewall 26 of the modified gate electrode 120. Also, the cap SiON layer 22, that has been protectively capping the modified gate electrode 120, for example, during the silicidation technique, is substantially and preferably completely removed from the modified gate electrode 120.

It is understood that the SiON layer 22 is preferably formed on top of the gate electrode 20 in the practice of this invention. However, this "cap" portion is not restricted to just the top portion of the electrode 20 but it may also be found on other portions of the semiconductor device 10. Although not shown in other areas, the cap portion 22 could conceivably be adjacent to, for example, at least a portion of the first sidewall 22, the second sidewall 24 and at least a portion of the substrate 16.

The invention has been described in reference to particular embodiments as set forth above. However, only the preferred embodiments of the present invention, and but a few examples of its versatility are shown and described in the present disclosure. It is to be understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A method of fabricating a plural material gate for a circuit device, comprising the steps of:
   a) providing a gate structure on a substrate, the gate structure having a top surface, and first and second sides,
   b) depositing a first layer on the gate structure, including a substantial portion of the top surface, and first and second sides,
   c) projecting a plurality of ions at a non-perpendicular angle, with respect to the top surface of the gate structure, wherein a first portion of the first layer adjacent to the first side of the gate structure, has a greater number of ions implanted than a second portion of the first layer adjacent to the second side of the gate structure,
   d) selectively etching the first layer so as to expose at least a portion of the first side of the gate structure while not exposing the second side,
   e) forming a silicide region in the first side of the gate structure, but not the second side of the gate structure, by utilizing the second portion of the first layer as a shield, and
   f) removing the second portion of the first layer.

2. A method as recited in claim 1, wherein forming a silicide region in the first side of the gate structure of step (e) further comprises the steps of:
   i. depositing a metal layer on the gate structure, including a substantial portion of the top surface, the first side, and the second portion of the first layer,
   ii. heating said device to form the silicide region in the first side of the gate structure by utilizing a portion of the metal layer, and
   iii. removing a remaining portion of the metal layer.

3. A method as recited in claim 1, wherein providing the gate structure of step (a) further comprises the steps of:
   i. forming a polysilicon layer on the substrate,
   ii. forming a cap layer on the polysilicon layer,
   iii. patterning and etching the polysilicon layer using the cap layer as an etch stop to form a polysilicon gate structure thereby, wherein
   an upper portion of the gate structure comprises a remaining portion of the cap layer, and a lower portion of the gate structure comprises a remaining portion of the polysilicon layer.

4. A method as recited in claim 3, wherein the remaining portion of the cap layer, during the forming of the silicide region, protects a top surface of the remaining portion of the polysilicon layer.

5. A method as recited in claim 3, further comprising the step of:
   i. removing the remaining portion of the cap layer, after step (e) of forming the silicide region.

6. A method as recited in claim 3, wherein the projecting step (c) utilizes the remaining portion of the cap layer as a shield of at least a top surface of the remaining portion of the polysilicon layer due to blocking of the projected ions.

7. A method as recited in claim 3, wherein the upper portion of the gate structure comprises SiON.

8. A method as recited in claim 1, wherein the first layer of step (b) comprises an oxide layer.

9. A method as recited in claim 1, wherein the first layer of step (b) comprises $SiO_2$.

10. A method as recited in claim 8, wherein depositing the first layer of step (b) is performed by chemical vapor deposition (CVD).

11. A method as recited in claim 1, wherein the formation of the silicide region of step (e) is performed by rapid thermal annealing (RTA).

12. A method as recited in claim 1, wherein
   at least a portion of the first side of the gate structure is approximately adjacent to at least a portion of a source side of a dual-material gate field effect transistor, and
   at least a portion of the second side of the gate structure comprises an N-type gate material that is approximately adjacent to at least a portion of a drain side of a dual-material gate field effect transistor.

13. A method as recited in claim 1, wherein
   at least a portion of the first side of the gate structure is approximately adjacent to at least a portion of a source side of a dual-material gate field effect transistor, and
   at least a portion of the second side of the gate structure comprises a P-type gate material that is approximately adjacent to at least a portion of a drain side of a dual-material gate field effect transistor.

14. A method as recited in claim 1, wherein the projected ions of step (c) comprise ions of an inert gas.

15. A method as recited in claim 14, wherein the projected ions of step (c) comprise nitrogen.

16. A method as recited in claim 15, wherein the first layer comprises silicon dioxide and wherein the selective etching in step (d) further comprises:
   utilizing an HF solution, wherein an etch rate of the oxide with a relatively higher nitrogen ion implantation is faster than that of the oxide with a relatively lower nitrogen ion implantation.

17. A method as recited in claim 1, wherein the selective etching in step (d) further comprises utilizing an HF etching solution.

18. A method as recited in claim 1, wherein
   i. the circuit device is a semiconductor FET device,
   ii. the plural material gate is a dual material gate of the semiconductor device,
   iii. the first side is adjacent a source side of the semiconductor device,
   iv. the second side is adjacent a drain side of the semiconductor device, and
   v. the first layer is comprised of an oxide.

19. A method as recited in claim 1, wherein
   at least a portion of the first side of the gate structure comprises a material with a higher work function than a material that comprises at least a portion of the second side of the gate structure.

20. A method as recited in claim 1, wherein
   at least a portion of the first side of the gate structure comprises a material with a lower work function than a material that comprises at least a portion of the second side of the gate structure.

21. A method of forming a dual-material gate for an FET comprising the steps of:

a) providing a gate structure on a substrate, the gate having a first and second side, b) forming a barrier layer over the gate structure, a first portion of the barrier layer adjacent the first side, and a second portion of the barrier layer adjacent the second side, c) directing implant ions onto the gate structure and substrate at an angle so as to shield the second portion against the ions, thereby forming a relatively lower concentration of ions in the second portion than in the first portion, thereby comprising a different ion concentration relationship, d) removing the first portion while retaining the second portion in a selective etching process based upon the different ion concentration relationship, e) forming a silicide region in the first side of the gate structure by utilizing the second portion of the first layer as a shield, f) removing the second portion of the first layer.

22. A method as recited in claim 21, wherein the barrier layer is comprised of an oxide material.

23. A method as recited in claim 21, wherein the implant ions are comprised of an inert gas.

24. A method as recited in claim 21, wherein forming the silicide region in the first side of the gate structure of step (e) further comprises the steps of:
   i. depositing a metal layer on the gate structure, including a substantial portion of a top surface, the first side, and the second portion of the barrier layer,
   ii. heating the gate structure to form the silicide region in the first side of the gate structure by utilizing a portion of the metal layer, and
   iii. removing a remaining portion of the metal layer.

25. A method as recited in claim 21, wherein providing the gate structure of step (a) further comprises the steps of:
   i. forming a polysilicon layer on the substrate,
   ii. forming a cap layer on the polysilicon layer,
   iii. patterning and etching the polysilicon layer using the cap layer as an etch stop to form a polysilicon gate structure thereby, wherein
      an upper portion of the gate structure comprises a remaining portion of the cap layer, and a lower portion of the gate structure comprises a remaining portion of the polysilicon layer.

26. A method as recited in claim 25, further comprising the step of:
   i. removing the remaining portion of the cap layer, after step (e) of forming the silicide region.

27. A method as recited in claim 25, wherein the upper portion of the gate structure comprises SiON.

28. A method as recited in claim 21, wherein the barrier layer of step (b) comprises an oxide layer.

29. A method as recited in claim 28, wherein depositing the barrier oxide layer of step (b) is performed by chemical vapor deposition (CVD).

30. A method as recited in claim 21, wherein the formation of the silicide region of step (e) is performed by rapid thermal annealing (RTA).

31. A method as recited in claim 21, wherein
   at least a portion of the first side of the gate structure is approximately adjacent to at least a portion of a source side of a dual-material gate field effect transistor, and
   at least a portion of the second side of the gate structure comprises an N-type gate material that is approximately adjacent to at least a portion of a drain side of a dual-material gate field effect transistor.

32. A method as recited in claim 21, wherein at least a portion of the first side of the gate structure is approximately adjacent to at least a portion of a source side of a dual-material gate field effect transistor, and at least a portion of the second side of the gate structure comprises a P-type gate material that is approximately adjacent to at least a portion of a drain side of a dual-material gate field effect transistor.

33. A method as recited in claim 21, wherein the projected ions of step (c) comprise ions of an inert gas.

34. A method as recited in claim 33, wherein the projected ions of step (c) comprise nitrogen.

35. A method as recited in claim 21, wherein the selective etching process in step (d) further comprises:

utilizing an HF solution, wherein an etch rate of the oxide with a relatively higher nitrogen implantation is faster than that of the oxide with a relatively lower nitrogen implantation.

36. A method as recited in claim 21, wherein at least a portion of the first side of the gate structure comprises a material with a higher work function than a material that comprises at least a portion of the second side of the gate structure.

37. A method as recited in claim 21, wherein at least a portion of the first side of the gate structure comprises a material with a lower work function than a material that comprises at least a portion of the second side of the gate structure.

38. A product produced according to the method as recited in claim 21.

39. A product as recited in claim 38, wherein the implant ions are comprised of nitrogen, and the selective etching process comprises utilizing an HF etching solution.

40. A method of fabricating a plural material gate for a circuit device, comprising the steps of:

a. providing a gate structure on a substrate, the gate structure having a top surface, and first and second sides, b. depositing a first layer on the gate structure, including a substantial portion of the top surface, and first and second sides, c. projecting a plurality of ions at a non-perpendicular angle, with respect to the top surface of the gate structure, wherein a second portion of the first layer adjacent to the second side of the gate structure, has a fewer number of ions implanted than a first portion of the first layer adjacent to the first side of the gate structure, d. processing the first layer to provide an asymmetric oxide spacer to shield at least a part of a second side of the gate structure, e. forming a silicide region on at least a part of a first side of the gate structure.

41. A method as recited in claim 40, wherein the first side of the gate structure is a source side of a P-type circuit device, and the second side of the gate structure is a drain side of a P-type circuit device.

42. A method as recited in claim 40, wherein the first side of the gate structure is a source side of an N-type circuit device, and the second side of the gate structure is a drain side of an N-type circuit device.

* * * * *